United States Patent [19]

Imaizumi et al.

[11] 4,443,812
[45] Apr. 17, 1984

[54] HIGH-BREAKDOWN-VOLTAGE SEMICONDUCTOR DEVICE

[75] Inventors: Ichiro Imaizumi, Tokyo; Masatoshi Kimura, Hachioji; Shikayuki Ochi, Akishima; Masayoshi Yoshimura, Tokyo; Takashi Yamaguchi, Tachikawa; Toyomasa Koda, Kokubunji, all of Japan

[73] Assignee: Hitachi, Ltd., Tokyo, Japan

[21] Appl. No.: 231,285

[22] Filed: Feb. 4, 1981

[30] Foreign Application Priority Data

Feb. 4, 1980 [JP] Japan .................................. 55-11506

[51] Int. Cl.³ ..................... H01L 29/44; H01L 27/04; H01L 29/72
[52] U.S. Cl. ........................................ 357/53; 357/35; 357/51
[58] Field of Search ...................... 357/52, 53, 51, 35, 357/89

[56] References Cited

U.S. PATENT DOCUMENTS 4,161,742 7/1979 Kane ..................................... 357/48
4,319,262 3/1982 Bertotti et al. ........................ 357/35

Primary Examiner—James W. Davie
Attorney, Agent, or Firm—Antonelli, Terry & Wands

[57] ABSTRACT

A high-breakdown-voltage semiconductor device wherein a resistor body made of a P-type impurity region is disposed in a surface region of an N-type semiconductor body so as to form a resistor element, a P-type low doped region is disposed around the resistor body, and a plate layer which extends from a high potential electrode of the resistor body covers a main part of the P-type low doped region.

4 Claims, 17 Drawing Figures

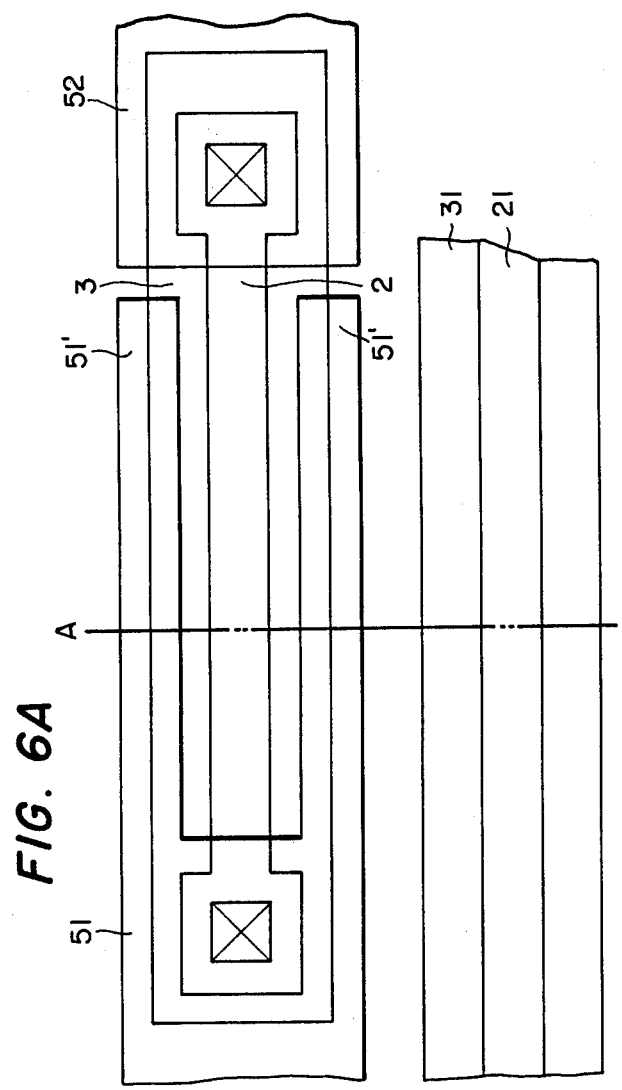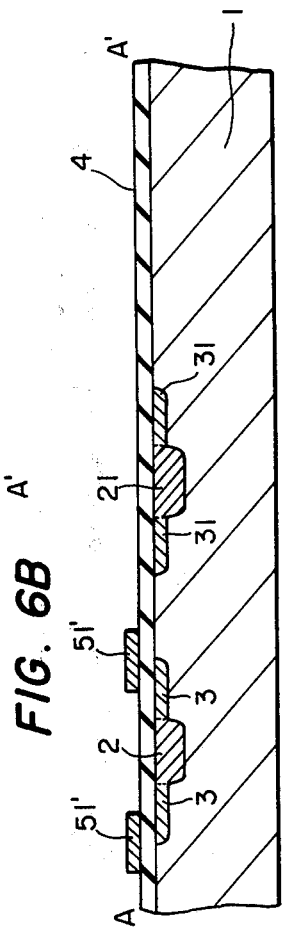

HIGH-BREAKDOWN-VOLTAGE SEMICONDUCTOR DEVICE

Background of the Invention

This invention relates to a high-breakdown-voltage semiconductor device, and more particularly to a semiconductor device which has enhanced the breakdown voltage value of a PN junction in an integrated circuit.

An important factor which prevents obtaining a breakdown voltage for a monolithic IC (monolithic integrated circuit) is the lowering of the breakdown voltage ascribable to an interconnection layer within a chip.

Referring to FIGS. 1A and 1B, there will be explained the lowering of the breakdown voltage value of a PN junction between an impurity region 2 and a semiconductor body 1 which is attributable to an interconnection layer 5 within a chip. FIG. 1A is a plan view, while FIG. 1B is a sectional view. Here, the polarity of the semiconductor body 1 is supposed to be the N-type conductivity. The region 2 is a P-type diffusion layer, which is used as a base region of an NPN transistor, an emitter or collector region of a PNP transistor, or a resistor body in an ordinary IC.

When it is intended to render the breakdown voltage high, the breakdown voltage value of the diffusion layer itself is principally determined by the curvature of the PN junction which it forms with the body 1. A case where the body 1 has a resistivity of 20 Ω-cm and the diffusion layer 2 has a diffusion depth of 2.5 μm and a sheet resistance of 200 Ω/□, the breakdown voltage value of the diffusion layer becomes approximately 140 V. In order to enhance the breakdown voltage value of the diffusion layer itself, there have been performed such measures as (1) increasing the diffusion depth, and (2) forming regions 3 identical in the conductivity type to, and lower in the impurity concentration than, the diffusion layer 2 around this layer as shown in FIGS. 2A and 2B (FIG. 2A is a plan view, while FIG. 2B is a sectional view). By way of example, when the diffusion depth is made 5 μm, the breakdown voltage value can be made approximately 250 V. In the case of the low doped regions 3, the regions 3 having a sheet resistance on the order of 10 kΩ/□ are formed around the region 2 at a width of or above 10 μm, whereby the breakdown voltage between the region 2 and the body 1 can be raised up to about 200 V.

However, when the metal interconnection layer 5 passes over the diffusion layer 2 through an insulating film (of, e.g., $SiO_2$) 4, as shown in FIG. 1B and FIG. 2B, it becomes impossible to hold the breakdown voltage value mentioned above. More specifically, when the thickness of the insulating film 4 is made 1 μm in a case where the electric potential of the interconnection layer 5 is equal to that of the body 1, the breakdown voltage value of the region 2 becomes approximately 90 V, and it becomes about 140 V even with the measure of adding the low doped regions 3 as illustrated in FIGS. 2A and 2B. The reason for this is that, since the interconnection layer 5 hinders, due to its potential, a depletion layer from extending from the impurity region 2 onto the side of the body 1, the field intensity of the surface part of the body becomes high, so the breakdown voltage value becomes lower than the original value. In the case of FIGS. 2A and 2B, the breakdown voltage value can be raised in comparison with that in the case of FIGS. 1A and 1B in dependence on the impurity concentration of the impurity regions 3. However, the electric field of the surface part on the boundary between the impurity regions 2 and 3 becomes intense similarly, with the result that the breakdown voltage value lowers.

As a method for relieving the breakdown voltage degradation, there has been the expedient of increasing the thickness of the insulating film 4. In the manufacturing process, however, it is difficult to make the thickness above 1 μm in the present situation.

FIG. 3A shows a resistor element which is used in a high-breakdown-voltage IC. Numerals 2 and 21 designate P-type diffusion layers, which serve as resistor bodies and which are formed in an N-type semiconductor body (1 in FIGS. 3B and 3C). Numerals 51 and 52 indicate leading-out electrodes for the resistor body 2, in which the electrode 51 is a high potential electrode and the electrode 52 is a low potential electrode. The feature of this resistor body resides in that an extension 51' of the high potential electrode 51 covers the resistor body 2. The extension is provided to the end of preventing a parasitic MOS transistor which appears between the resistor body 2 and the other resistor body 21 proximate thereto. FIG. 3B shows a sectional structural view taken along line A–A' in FIG. 3A. The effect of the metal plate 51' will be described with reference to FIG. 3B. In the absence of the metal plate 51', the sectional structure along the line A–A' becomes as shown in FIG. 3C. In a case where a potential difference exists between the resistor bodies 2 and 21 and where charges 6 of a potential greater than the threshold voltage $V_{TH}$ of the MOS transistor formed by the resistor bodies 2 and 21 have gotten on an insulating film 4, the parasitic MOS transistor falls into the conductive state and current flows across the resistor bodies 2 and 21. The charges 6 are generated by the so-called mobile charge phenomenon, which develops in such manner that principally electrons from a bare semiconductor or metal interconnection layer move on an insulating film. This phenomenon is more liable to occur at an intenser electric field, and is inevitably involved in a high-breakdown-voltage IC. In addition, the potential of the charges must be considered to reach the lowest potential (greatest in the absolute value) of a IC chip. In an IC exceeding 50 V, accordingly, a measure against the parasitic MOS transistor needs must be taken.

Means for preventing the appearance of the parasitic MOS transistor due to the mobile charges on the surface is the metal plate 51' in FIG. 3B. As illustrated in FIG. 3B which is the section along the line A–A' in FIG. 3A, even in the presence of the mobile charges 6, the parasitic MOS transistor does not appear between the resistor bodies 2 and 21 when the potential of the metal plate 51' is made the highest potential of the resistor body 2 and higher than the potential of the resistor body 21 in advance. Conversely, in case where the potential of the resistor body 21 is higher than that of the resistor body 2, the resistor body 21 may be covered with a metal plate of the highest potential of the resistor body 21. Accordingly, the most reliable method preventive of the parasitic MOS transistor is to cover the resistor body with a metal plate having the highest potential within the IC. A problem in this case is that the breakdown voltage value between the resistor body and the semiconductor body lowers as stated before. Further, even in the case of employing the metal plate 51' in FIG. 3A, it is to be understood that the lowering of the breakdown voltage between the resistor body and the semiconductor body develops when a voltage across both the ends of the resistor is high.

Summary of the Invention

The invention has for its object to provide the structure of a semiconductor device which can be used to construct a high-breakdown-voltage integrated circuit (high-breakdown-voltage IC). That is, this invention has for its object to place a semiconductor device having an impurity region and an interconnection layer to constitute a transistor, a resistor or the like, into a structure suitable to be rendered high in breakdown voltage.

Also, this invention has for its object to provide a new semiconductor device structure which can prevent the appearance of a parasitic MOS transistor and which has a high breakdown voltage.

In order to accomplish the objects, according to a semiconductor device of this invention, around an impurity region which constitutes a transistor, a resistor or the like, a low doped region (low impurity concentration region) having the same conductivity type as that of the impurity region is disposed, and further, an interconnection layer and/or plate layer which extends from a leading-out electrode which does not overlie the impurity region but overlies the low doped region. In the device of this invention, the electrode for the impurity region may be similar to that in the prior-art structure. The interconnection layer and/or plate layer to which this invention is directed signifies an interconnection layer which connects a contact electrode with another electrode, for example, another contact electrode or a bonding pad, a plate layer which extends from a contact electrode in order to prevent a parasitic MOS transistor, and so forth.

FIGS. 4A and 4B and FIGS. 5A and 5B show the fundamental structures of the configuration between an impurity region and an interconnection layer and/or plate layer in a semiconductor device of this invention. FIGS. 4A and 4B illustrate the first structure, in which FIG. 4A is a plan view and FIG. 4B is a sectional view. Referring to FIGS. 4A and 4B, an interconnection layer and/or plate layer 5 exists only over a low doped region 3 disposed around an impurity region 2 and terminates there. FIGS. 5A and 5B illustrate the second structure, in which FIG. 5A is a plan view and FIG. 5B a sectional view. Referring to FIGS. 5A and 5B, an interconnection layer and/or plate layer 5 passes over a low doped region 3 disposed around impurity regions 2 and through the interspace between the impurity regions 2. In FIGS. 4B and 5B, numeral 1 indicates a semiconductor body having the conductivity type opposite to that of the impurity region 2 and the low doped region 3.

Using the above fundamental structure, the semiconductor device of this invention can realize a high-breakdown-voltage IC.

Brief Description of the Drawings

FIGS. 6A and 6B are a plan view and a sectional view, respectively, showing a resistor element according to an embodiment of this invention.

Description of the Preferred Embodiments

This invention will be described in detail with reference to several embodiments.

Figure 3A:
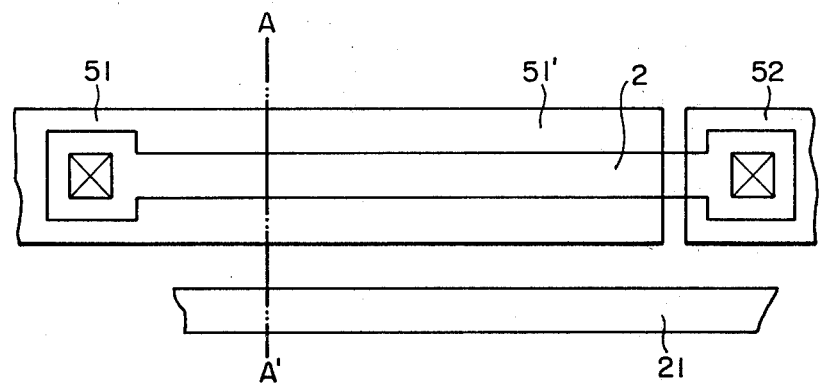
FIGS. 3A, 3B and 3C are views showing the relation between an impurity region and a metal plate in a resistor element.
Figure 4A:
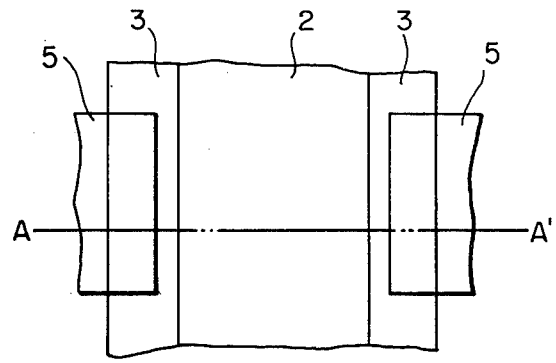
FIGS. 4A and 4B and FIGS. 5A and 5B are views showing the relationship between impurity regions and interconnection layers and/or plate layers in semiconductor devices of this invention.
Figure 4B:
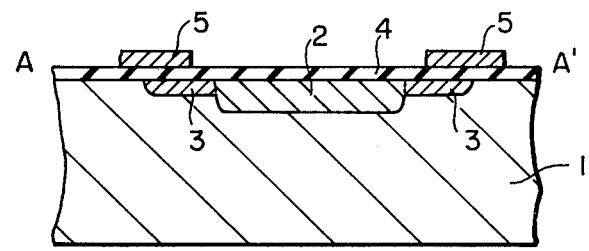

FIGS. 6A and 6B show an embodiment of a resistor element which adopts the structure of a high-breakdown-voltage semiconductor device according to this invention. FIG. 6A is a plan view, while FIG. 6B is a sectional view taken along line A-A' in FIG. 6A. The resistor element of this embodiment has a structure which prevents the appearance of the parasitic MOS transistor described before with reference to FIGS. 3A-BC and which does not have lowering of the breakdown voltage. This resistor element employs the high-breakdown-voltage structure in FIGS. 4A and 4B.

Referring to the figures, numeral 1 designates an N (or P)-type Si body (impurity concentration: $5 \times 10^{14}$ cm$^{-3}$), numerals 2 and 21 P (or N) type impurity regions (impurity concentration: $1 \times 10^{19}$ cm$^{-3}$, depth: 3 μm) serving as resistor bodies, numerals 3 and 31 P (or N) type low impurity concentration regions (low doped regions) (impurity concentration: $1 \times 10^{16}$ cm$^{-3}$, depth: 1 μm), numeral 4 an insulating film made of $SiO_2$ or the like, and numerals 51 and 52 electrodes made of Al or other conductor.

Figure 3B:
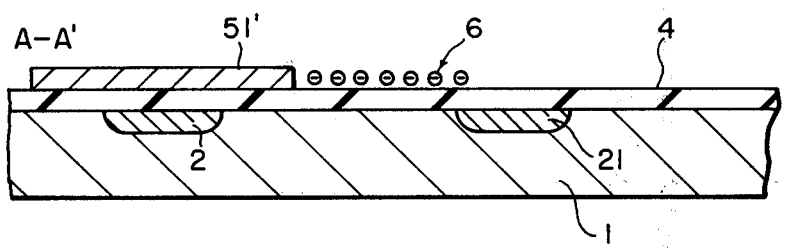
Figure 3C:
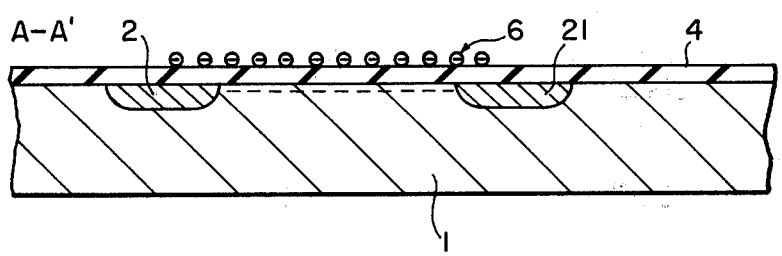

In the resistor element of FIGS. 6A and 6B, the electrode 51 is made the high potential electrode of the impurity region 2 which serves as the resistor body and which has the conductivity type opposite to that of the semiconductor body 1. The resistor element is the joint the same as in FIGS. 3A and 3B in the point that the parasitic MOS transistor is prevented by the electric potential of the extension 51' of the electrode 51. The electrode 52 is characterized in that the extension 51' lies only over the low doped region 3 in the place having a great potential difference with respect to the underlying resistor body 2, to prevent lowering of the breakdown voltage of the impurity region 2.

Figure 1A:
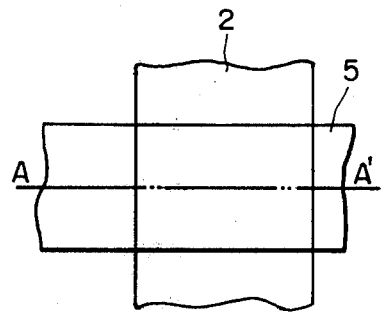
FIGS. 1A and 1B are a plan view and a sectional view, respectively, showing the relation between an impurity region and an interconnection layer in an ordinary semiconductor device.
Figure 1B:
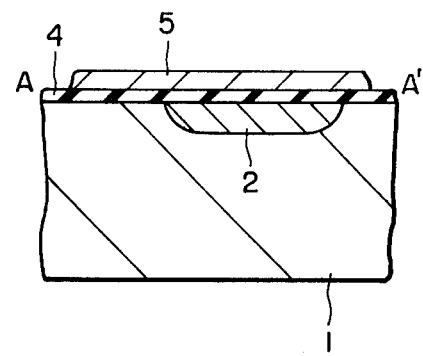
Figure 2A:
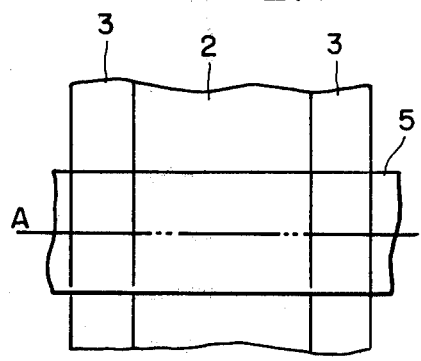
FIGS. 2A and 2B are a plan view and a sectional view, respectively, showing the relation between an impurity region and an interconnection layer in another ordinary semiconductor device.
Figure 2B:
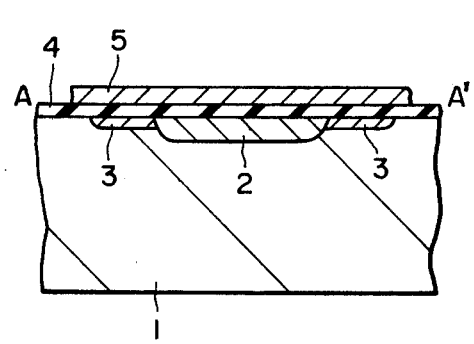
Figure 7:
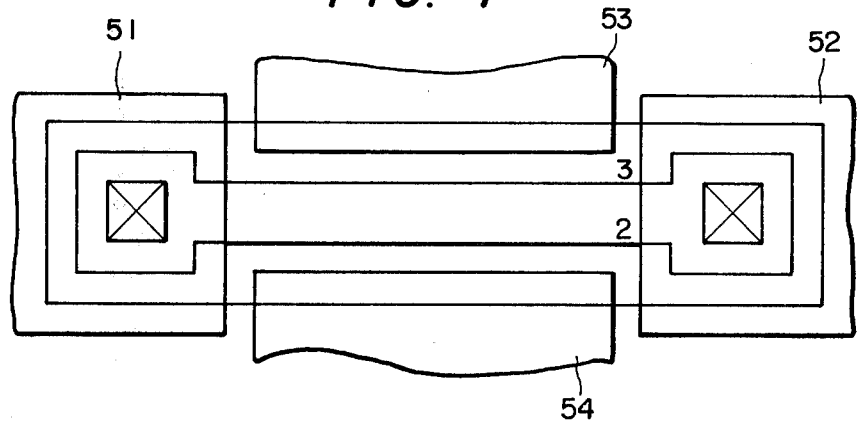
FIG. 7 is a plan view showing a resistor element according to another embodiment of this invention.

FIG. 7 illustrates employing metal plate layers 53 and 54 made of Al or other conductors and having a potential higher than that of the high potential electrode 51. The plate layers 53 and 54 need not have the identical potential.

Owing to the structure described above, the enhancement of the breakdown voltage value and the prevention of the parasitic MOS transistor can be achieved for the resistor element in an integrated circuit without adding any complicated processing step.

Figure 5A:
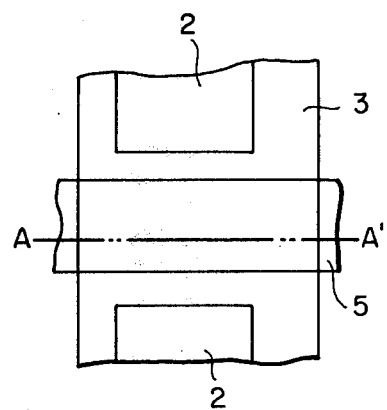
Figure 5B:
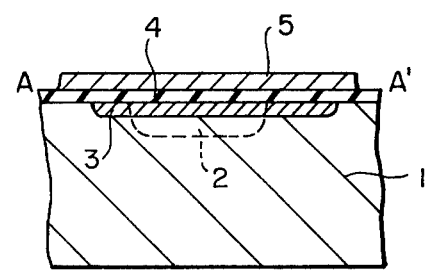
Figure 8A:
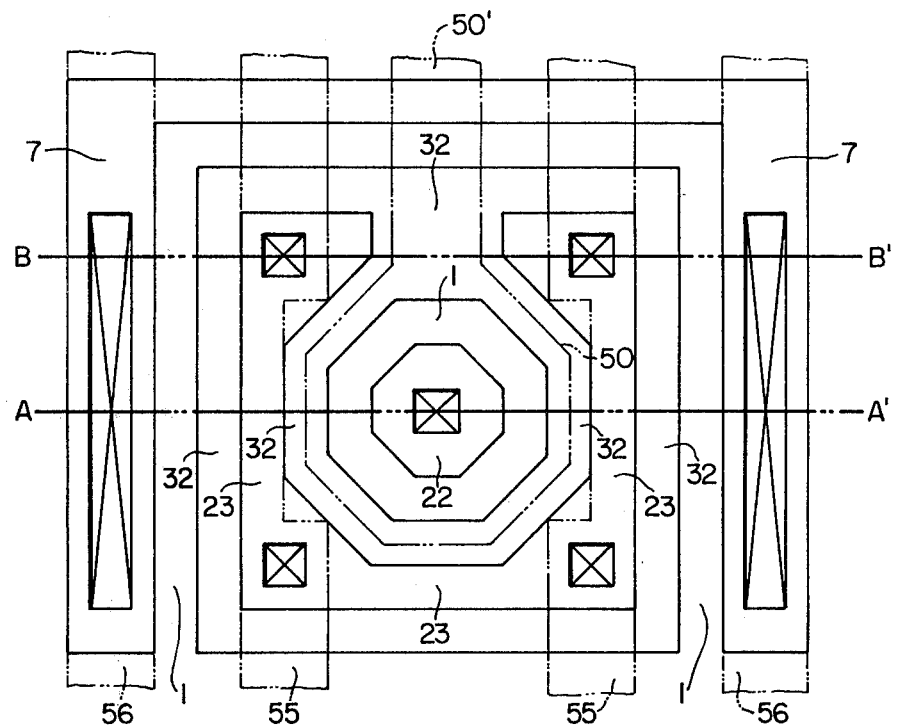
FIGS. 8A, 8B and 8C are constructional views of a PNP transistor according to another embodiment of this invention.
Figure 8B:
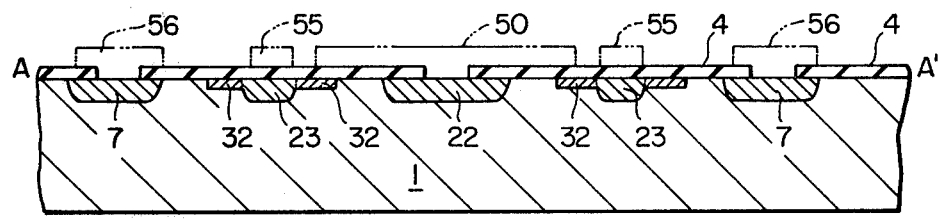
Figure 8C:
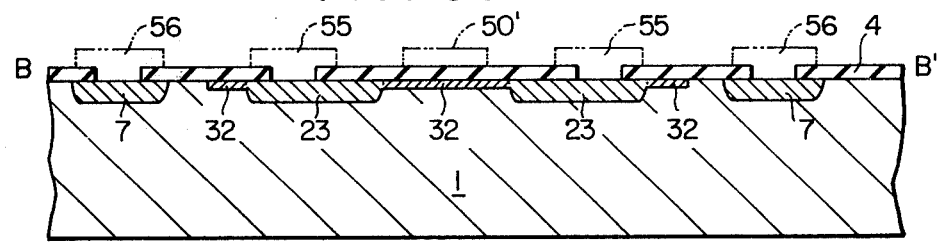

Now, there will be described an embodiment of a PNP transistor which employs the structure of the high-breakdown-voltage semiconductor device according to this invention. FIG 8A is a plan view, FIG. 8B is a sectional view taken along line A-A' in FIG. 8A, and FIG. 8C is a sectional view taken along line B-B' in FIG. 8A. The PNP transistor of this embodiment uses the high-breakdown-voltage structure of FIGS. 5A and 5B.

Referring to FIGS. 8A, 8B and 8C, numerals 22 and 23 indicate P-type impurity regions (impurity concentration: approximately $5 \times 10^{18}/cm^3$), which form an emitter region and a collector region of the lateral PNP transistor respectively. An N-type semiconductor body (for example, Si body) 1 serves as a base region (impurity concentration: approximately $10^{14}/cm^3$). Shown at numeral 7 is an N-type high impurity concentration region (highly doped region) (impurity concentration: approximately $10^{20}/cm^3$) for a base electrode.

An electrode 50 (dotted line) which is connected to the emitter region and which is made of Al or other conductor extends to over a P-type low impurity concentration region (low doped region) 32 (impurity concentration: approximately $10^{12}/cm^3$) which extends from the collector region 23. Moreover, an interconnection layer 50' (dotted line) does not pass over the collector region 23 as shown by the B-B' section in FIG. 8C. Owing to this structure, the collector - emitter breakdown voltage can be enhanced. In addition, since a base width region (between the regions 22 and 32 in the A-A' section in FIG. 8B) is fully covered with the interconnection layer 50 of an emitter potential, the PNP transistor is not influenced by mobile charges or ions and achieves the enhancement of reliability.

Further, by properly controlling the magnitude of the base width (which is the distance between the regions 22 and 32 in the A-A' section in FIG. 8B) and the length of the region 32, it becomes possible to determine the breakdown voltage by the distance between the regions 22 and 23 and to determine the current amplification factor of the PNP transistor by the base width. This signifies that the enhancement of the breakdown voltage and the enhancement of the grounded-emitter D.C. current gain $h_{FE}$ are compatible, the compatibility having been difficult in prior-art PNP transistors. Yet further, since the base width can be set without any direct relation with the breakdown voltage, the frequency characteristic can also be improved.

As described above, the PNP transistor which has a higher breakdown voltage than the prior-art transistor and which is high in the grounded-emitter D.C. current gain $h_{FE}$ as well as the current-gain-bandwidth frequency $f_T$ and excellent in the reliability can be readily realized by employing the structure shown in FIGS. 8A, 8B and 8C.

In FIGS. 8A, 8B and 8C, numerals 55 and 56 indicate a collector electrode and a base electrode made of Al or the like, respectively, and numeral 4 indicates an insulating film made of $SiO_2$ or other insulating material.

What is claimed is:

1. A high-breakdown-voltage semiconductor device having a semiconductor body of a first conductivity type, a first impurity region of a second conductivity type disposed in a surface region of the body, and a plate layer disposed on an insulating film provided on said surface of the body, a second impurity region of said second conductivity type which is disposed in contact with said first impurity region and is doped lower than said first impurity region, and wherein said plate layer comes into contact with a first part of said first impurity region through a hole provided in said insulating film and extends overlying said second impurity region and does not overlie said first impurity region except for a second part of said first impurity region surrounding said first part of said first impurity region.

2. A high-breakdown-voltage semiconductor device according to claim 1, wherein said first impurity region functions as a resistor and said plate layer is an extension of a high potential electrode of said resistor.

3. A high-breakdown-voltage semiconductor device according to claim 1, wherein said first impurity region is a collector region of a lateral PNP transistor and said plate layer is an extension of an emitter electrode of said lateral PNP transistor, said plate layer passing over said second impurity region which is provided in a gap region of said collector region.

4. A high-breakdown-voltage semiconductor device according to claim 3, wherein said plate layer which is said extension of said emitter electrode covers a part of the body surface region between the emitter and collector of said PNP transistor and terminates over said second impurity region around said collector region.

* * * * *